(12) United States Patent
Lin et al.

(10) Patent No.: US 6,614,058 B2
(45) Date of Patent: Sep. 2, 2003

(54) LIGHT EMITTING SEMICONDUCTOR DEVICE WITH A SURFACE-MOUNTED AND FLIP-CHIP PACKAGE STRUCTURE

(75) Inventors: Ming-der Lin, Hsin Chu (TW); Kwang-ru Wang, Chia Yi (TW)

(73) Assignee: Highlink Technology Corporation, Taiwan (TW)

(*) Notice: Subject to any disclaimer, the term of this patent is extended or adjusted under 35 U.S.C. 154(b) by 0 days.

(21) Appl. No.: 10/192,171

(22) Filed: Jul. 9, 2002

(65) Prior Publication Data

US 2003/0010986 A1 Jan. 16, 2003

(30) Foreign Application Priority Data

Jul. 12, 2001 (TW) ........................................ 90117161 A

(51) Int. Cl.[7] ................................................ H01L 33/00
(52) U.S. Cl. .............................. 257/99; 257/100; 257/98
(58) Field of Search ............................ 257/99, 98, 100

(56) References Cited

U.S. PATENT DOCUMENTS

| | | | | |
|---|---|---|---|---|
| 5,814,837 A | * | 9/1998 | Okazaki | 257/91 |
| 5,990,500 A | * | 11/1999 | Okazaki | 257/99 |
| 6,111,272 A | * | 8/2000 | Heinen | 257/94 |
| 6,169,294 B1 | * | 1/2001 | Biing-Jye et al. | 257/79 |
| 6,268,618 B1 | * | 7/2001 | Miki et al. | 257/99 |
| 6,355,946 B1 | * | 3/2002 | Ishinaga | 257/98 |
| 6,365,429 B1 | * | 4/2002 | Kneissl et al. | 438/46 |
| 6,474,531 B2 | * | 11/2002 | Ozawa | 228/103 |

* cited by examiner

Primary Examiner—Jerome Jackson
(74) Attorney, Agent, or Firm—Martine & Penilla, LLP

(57) ABSTRACT

A light emitting semiconductor device with a surface-mounted and flip-chip package structure is disclosed. The light emitting semiconductor device includes an insulating substrate and an LED. The LED includes a substrate, a first-type semiconductor layer, a first electrode formed on part of the first-type semiconductor layer surface, a second-type semiconductor layer formed on the first-type semiconductor layer surface but not covering the first electrode, and a second electrode formed on the second-type semiconductor layer. Two electrode layers are formed on the two sides of the insulating substrate and extend upwardly and downwardly to the upper and lower surface of the insulating substrate. The device is characterized in that the LED is mounted on the insulating substrate by a flip chip method and the insulating substrate is formed with two electrode layers at both side walls to surface-mounted with the LED.

23 Claims, 4 Drawing Sheets

LIGHT EMITTING SEMICONDUCTOR DEVICE WITH A SURFACE-MOUNTED AND FLIP-CHIP PACKAGE STRUCTURE

FIELD OF THE INVENTION

The present invention generally relates to a light emitting semiconductor device with a flip-chip package structure, especially to a light emitting semiconductor device with a surface-mounted and flip-chip package structure.

DESCRIPTION OF THE RELATED ART

Traditionally, the package structures of light emitting semiconductor devices include "lead-types" and "chip-types". A lead-type package structure of a light emitting semiconductor device is shown in FIG. 1. The light emitting diode 100 includes a light emitting component 102, a mount lead 105 and an inner lead 106. The mount lead 105 includes a cup 105a and a lead 105b. The light emitting component 102 is installed on the recess of the cup 105a, which is filled with an epoxy coating resin 101. In this way, the light emitting component 102 can be sealed in the coating resin 101. Then, the N-type electrode and the P-type electrode (not shown) of the light emitting component 102 are connected to the mount lead 105 and the inner lead 106 via the conductive wires 103, respectively. Finally, the light emitting component 102 and part of the mount lead 105 and the inner lead 106 are encapsulated in the molding material 104.

FIG. 2 shows the sectional view of a structure of a conventional LED.

The LED 200 is a GaN-based light emitting diode. As shown in the figure, the LED 200 includes a sapphire substrate 201 and a multi-layer structure consisted of an N-type GaN semiconductor layer 202 and a P-type GaN semiconductor layer 203. The N-type GaN semiconductor layer is formed on the surface of the sapphire substrate and the P-type GaN semiconductor layer is formed on the surface of the N-type GaN semiconductor layer. The P-type GaN semiconductor layer 203 is etched to form a exposed area 206 on the surface of the N-type GaN semiconductor layer 202, and an N-type electrode 205 is set up thereon. Meanwhile, a transparent P-type electrode 204 is formed on the surface of the P-type GaN semiconductor layer 203. A P-type electrode area (not shown) is defined on the transparent electrode 204 to expose part of the surface of the P-type GaN semiconductor layer 203. A P-type electrode 207 is then formed on the exposed area of the P-type GaN semiconductor layer 203 and electrically connected to the transparent electrode 204. Then, a traditional lead-type LED is formed.

Similarly, a chip-type LED package structure is shown as FIG. 3. In FIG. 3, the light emitting semiconductor device 300 includes an LED dice 303 fixed on a lead frame 302 with silver paste. The lead frame 302 is formed on the insulating substrate 301. Then, the steps of wire-bonding, encapsulating and dicing are processed in sequence. As to the wire-bonding step, the connecting points 304 of the LED dice 303 are connected to the lead frame 302 by gold leads 305. For the encapsulating step, the lead frame 302 is preheated on a framework and transferred into a laminator with the framework. In the laminator, an epoxy resin is filled into the framework and a hardening step is processed. After the encapsulating step, the LED dice 303 is encapsulated in a plastic cube 306 filled with an epoxy resin.

According to the package structure of the traditional light emitting semiconductor devices described above, all of the packaging steps, such as die bonding, wire bonding and encapsulating, are required in both the lead type structure and the chip-type structure. These manufacturing steps make it difficult to minimize the size of the device, and the manufacturing cost of the device cannot be reduced. Hence, it is required to simplify the packaging processes of the light emitting semiconductor devices.

SUMMARY OF THE INVENTION

Therefore, one object of the present invention is to provide an improved light emitting semiconductor device with simplified package structure.

Another object of the present invention is to provide an improved light emitting semiconductor device with a lower manufacturing cost.

Moreover, another object of the present invention is to provide an improved light emitting semiconductor device with higher light-emitting efficiency.

The light emitting semiconductor device of the present invention comprises: an insulating substrate; an LED, which includes a substrate, a first-type semiconductor layer formed on the substrate surface, a first electrode formed on part of the first-type semiconductor layer surface, a second-type semiconductor layer formed on the surface of the first-type semiconductor layer but does not cover the first electrode, and a second electrode formed on the surface of the second-type semiconductor layer; two bumps, formed on the insulating substrate; and two electrode layers, formed on the two sides of the insulating substrate and extend upwardly and downwardly to the upper and lower surface of the insulating substrate. The first and second electrodes of the LED are connected to the insulating substrate via the two bumps respectively. Meanwhile, the upper parts of the two electrode layers are connected with the first and second electrode of the LED via the two bumps.

According to the package structure described above, the light emitting semiconductor device of the present invention has both of the advantages of the flip-chip package structure and the surface-mounting process.

Meanwhile, the insulating substrate of the light emitting semiconductor device of the present invention has a thermal-expansion coefficient similar to an LED and a thermal-conductivity similar to a metal material. Hence, the device of the present invention possess a lower stress and better reliability, and can be operated with high power.

Further, the light emitting semiconductor device of the present invention is backside light-emitted type. Therefore, the device can reduce the light shelter effect caused by the electrodes and have higher light-emitted efficiency than the conventional light emitting semiconductor devices. Moreover, the device of the present invention is packaged with Surface-Mounting technology. This method simplifies the manufacturing process of the device and minimizes the size thereof.

Further, the packaging material of the present invention is cheaper than the traditional LED packaging materials. Hence, the manufacturing cost of the device is reduced.

DETAILED DESCRIPTION OF THE PREFERRED EMBODIMENT

Figure 4:
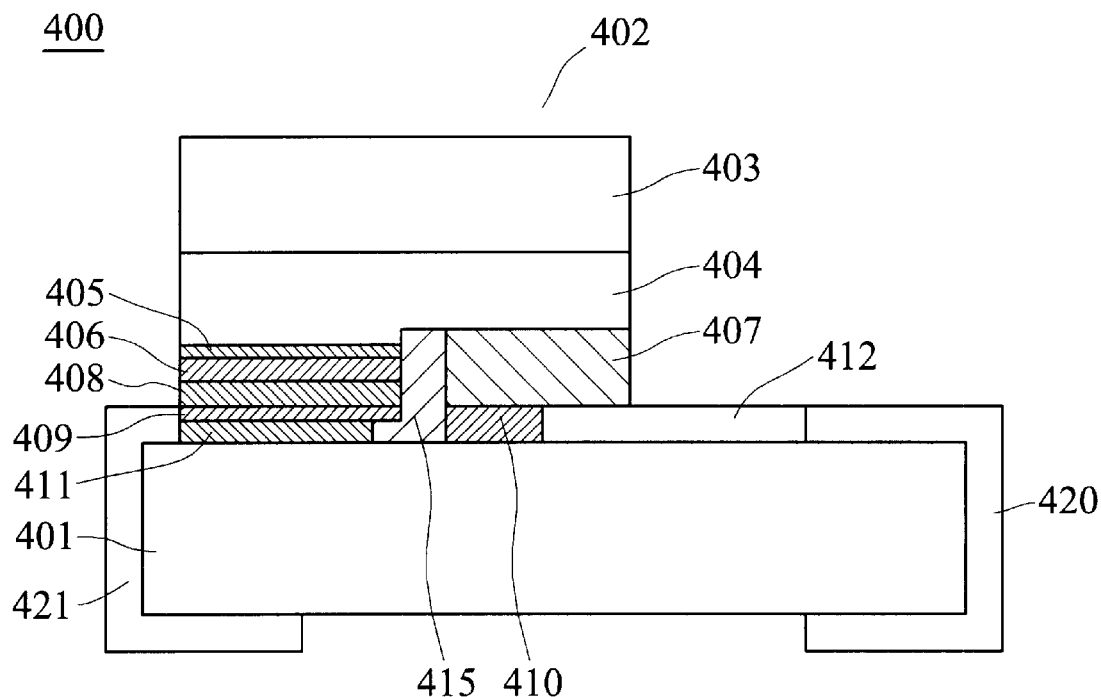
FIG. 4 is a cross sectional view illustrating a light emitting semiconductor device with a surface-mounted and flip-chip package structure according to the preferred embodiment of the present invention.

FIG. 4 is a cross sectional view illustrating a light emitting semiconductor device with a surface-mounted and flip-chip package structure of an preferred embodiment according to the present invention.

Figure 2:
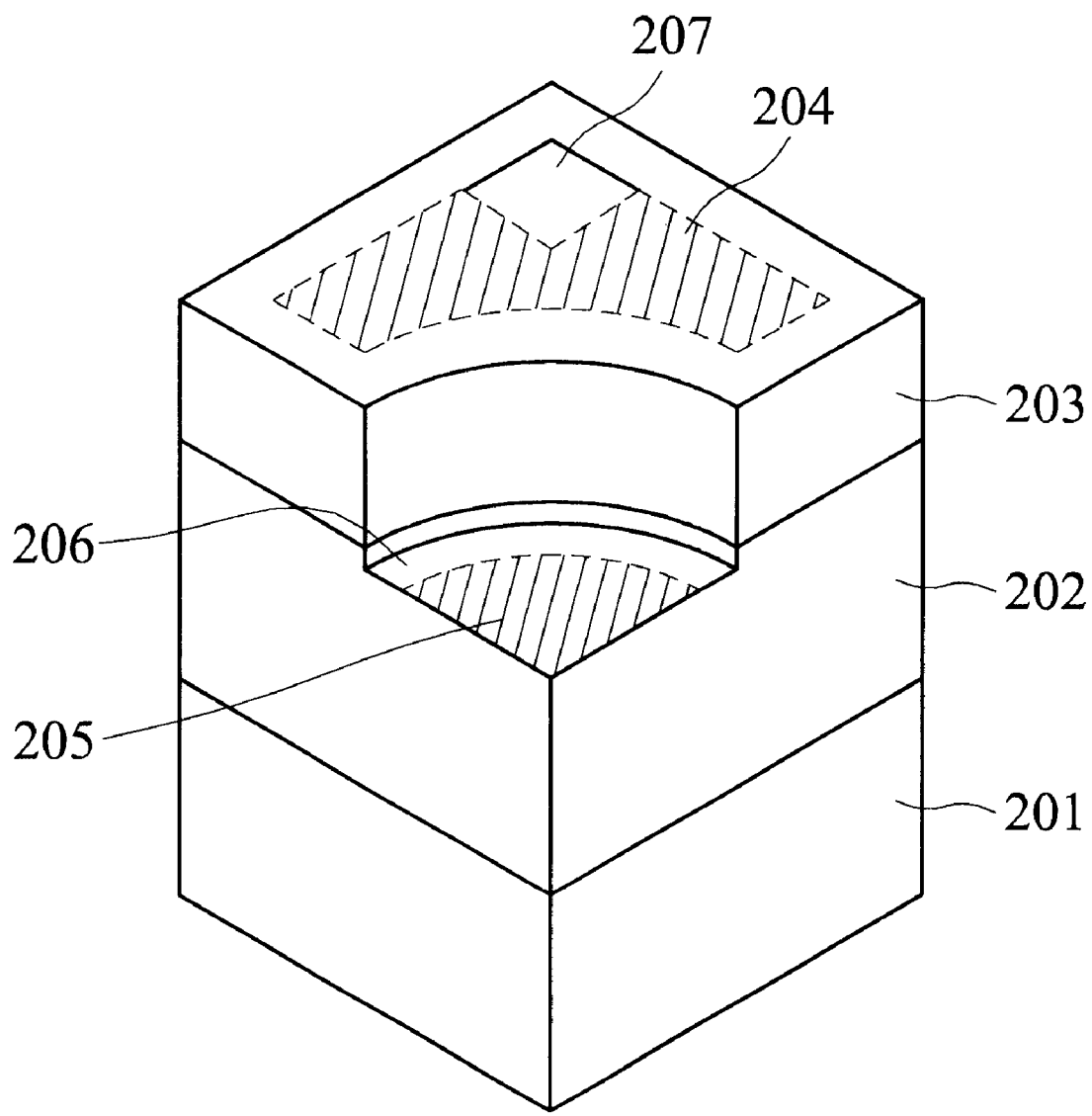
FIG. 2 is a schematic diagram illustrating the structure of the conventional LED device.
Figure 3:
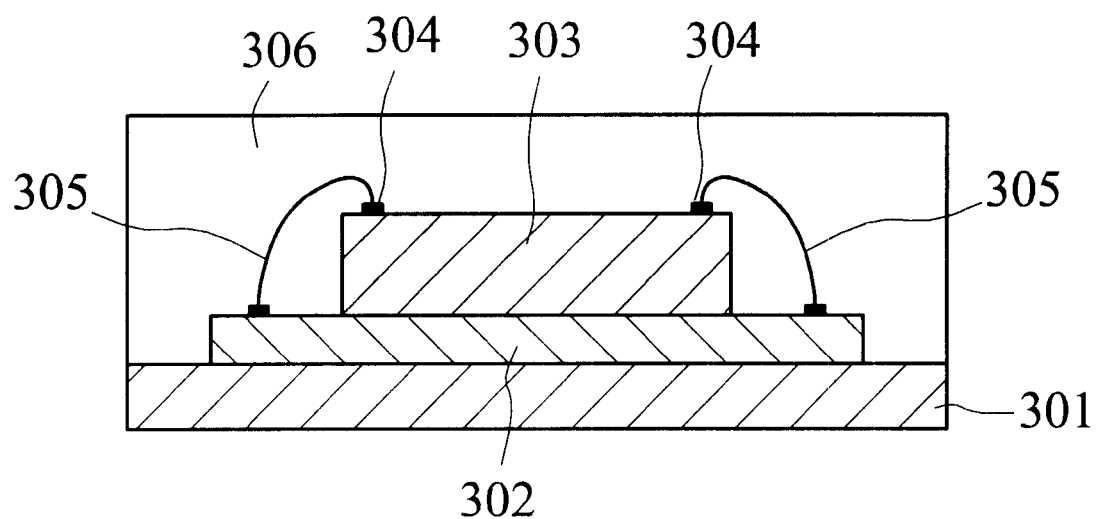
FIG. 3 is a schematic sectional view illustrating a chip-type package structure of a conventional LED device.

Referring to FIG. 4, a light emitting semiconductor device 400 includes an insulating substrate 401 and an LED 402. In this embodiment, the insulating substrate 401 is a ceramic substrate. The LED 402 is similar to the LED 200 shown in FIG. 2 and includes a sapphire substrate 403, an N-type GaN semiconductor layer 404, an active layer 405 and a P-type GaN semiconductor layer 406. As shown in the figure, the N-type GaN semiconductor layer 404 is deposited on the surface of the sapphire substrate 403 and the active layer 405 is deposited on part of the surface of the N-type GaN semiconductor layer 404. The P-type GaN semiconductor layer 406 is deposited on the active layer 405. In the LED 402, the active layer 405 is used as a light-emitting layer. The N-type GaN semiconductor layer 404 and the P-type GaN semiconductor layer 406 are both formed of four-element semiconductor material—$In_xAl_yGa_{1-x-y}N$. The x and y satisfy $0 \leq x \leq 1$, $0 \leq y \leq 1$ and $x+y=1$. Further, an electrode 407 is formed on the surface of the N-type GaN semiconductor layer 404 and a transparent electrode 408 is formed on the surface of the P-type GaN semiconductor layer 406. Moreover, a conductive reflection layer 409 is formed on the transparent electrode 408. It is noted that the sapphire substrate 403 can be replaced by the substrate formed of GaN, Si, GaAs, BN, InP, GaP, ITO, ZnO, SiC or diamond material.

According to the present invention, the LED 402 is fixed on the insulating substrate 401 by the "flip-chip" method. Two solder bumps 410 and 411 are formed on the insulating substrate 401 to be surface-mounted with the LED 402. The electrode 407 of the LED is connected to the solder bump 410, and the conductive reflection layer 409 is connected to the solder bump 411, respectively. A bonding pad 412 is also formed on the insulating substrate 401 and connected with the solder bump 410. Thus, a negative power source can be supplied to the electrode 407 via the bonding pad 412 and the solder bump 410.

Besides, as shown in FIG. 4, a non-conductive layer 415 (for example, an adhesive polyimide layer 415) is coated on the surface of the insulating substrate 401. The polyimide layer 415 is formed to be a projection type and can facilitate the alignment between the LED 402 and the insulating substrate 401. In the process of connecting the LED 402 to the bumps 410 and 411, a heating process is implemented to improve the adhesive structure. Thus, the polyimide layer 415 can avoid the misalignment between the insulating substrate 401 and the LED 402. Also, the polyimide layer 415 can prevent the electrode 407 and the conductive layer 409 of the LED 402 from slipping or moving from the bumps 410, 411, and thus can avoid the short circuit problem. As shown in the figure, the polyimide layer 415 is positioned between the bumps 410 and 411, and the LED 402 is mounted thereon. In this way, the LED 402 can be aligned with the insulating substrate 401 precisely. Moreover, because the semiconductor devices, such as light emitting semiconductor devices, are getting smaller in their size, short-circuit problems of positive and negative electrodes caused by size deviation are generated. Since the polyimide layer 415 is an insulator, the electrode 407 can be insulated with the transparent electrode 408 and the conductive reflection layer 409. Therefore, the short circuit problem result from bad connection is avoided and the leak-current on the surface of the device is reduced. Moreover, the electric characteristic of the light emitting semiconductor device is better and the efficiency and the lifetime thereof are increased.

Another characteristic of the present invention is that the light emitting semiconductor device 400 can be installed onto a PCB (Print Circuit Board) with Surface-Mounting technology. Referring to FIG. 4, two electrode layers 420 and 421 are formed on the two sides of the insulating substrate 401 and extend upwardly and downwardly to the upper and lower surfaces of the insulating substrate 401 respectively. The upper part of the electrode layer 420 is connected to the bonding pad 412, and the upper part of the electrode layer 421 is connected to the bump 411. Thus, the electrode layer 420 and 421 are electrically connected with the electrode 407 and the conductive reflection layer 409 of the LED 402, respectively.

Therefore, one major advantage of the light emitting semiconductor device of the invention is that it is a surface-mounted device with precise alignment. In the above embodiment, a ceramic substrate, which is widely used as the material of a substrate in traditional Surface-Mounting technology, is utilized as the insulating substrate. The ceramic substrate has the advantage of lower cost as comparing with the lead frames and the silicon substrates used in prior light emitting semiconductor devices. Moreover, the ceramic substrate is easy to dice and harder in structure.

The present invention reduces the cost of the packaging process by combining the traditional ceramic substrate with the mature Surface-Mounting technology of the passive-component ceramic substrates. The ceramic substrate is possessed with another advantage of good heat-dispersion, which can increase the lifetime and efficiency of the devices. Further, the present invention utilizes a polyimide layer as an insulation layer. Therefore, the short circuit problems of the positive and negative electrodes, especially when they are close to each other, can be inhibited. In addition to the functions of preventing the short circuit problems and inhibiting leak current phenomenon on the surface of the devices, the polyimide layer enables the devices to align precisely. Because of providing such a polyimide layer, the present invention can improve the production yield obviously and minimize the size of the light emitting semiconductor devices in a cheaper and more efficient way than the traditional process.

Meanwhile, because the ceramic substrate has thermal-expansion coefficient similar to LED and heat-conductivity similar to metal material, the light emitting semiconductor device of the present invention can possess lower stress and better reliability, and can be operate with high power. Therefore, the device of the present invention can be used in bad environment, such as desert. Moreover, the device of the present invention can be installed on the solder paste of PCB by utilizing the surface-mounted equipment on hand. Hence, as comparing with the prior light emitting semiconductor devices, the present invention provides a more simplified manufacturing process and a lower production cost.

Besides, in addition to the ceramic substrate, the insulating substrate described above also can be formed with a glass substrate, a silicon substrate with an insulation layer or a silicon substrate stacked with a multi-layer structure of insulation and metal layers. For different purpose, the silicon substrate can be deposited with different materials to form different insulation structures. For example, a simple structure can be formed by depositing a single insulation layer on the surface of the silicon substrate. On the other hand, a stacked multi-layer structure can be formed by depositing insulation and metal layers on the surface of the silicon substrate. The stacked multi-layer structure can be produced as follows: a metal layer is formed on the silicon substrate surface, and then an insulation layer is formed on the surface of the metal layer; or an insulation layer is formed on the silicon substrate surface first, and a metal layer is formed on the surface of the insulation layer, and then another insulation layer is formed on the surface of the metal layer. By repeating the above steps, a stacked multi-layer structure can be obtained.

The material of the metal layer can be Al, Au, Ag, Ni or Pt, and the material of the insulation layer can be $SiO_x$, $SiN_x$, TiN, $Al_2O_3$, $TiO_2$, $Ta_2O_5$, TEOS (tetra-ethyl-Ortho-Silicate), epoxy or polyimide.

Figure 1:
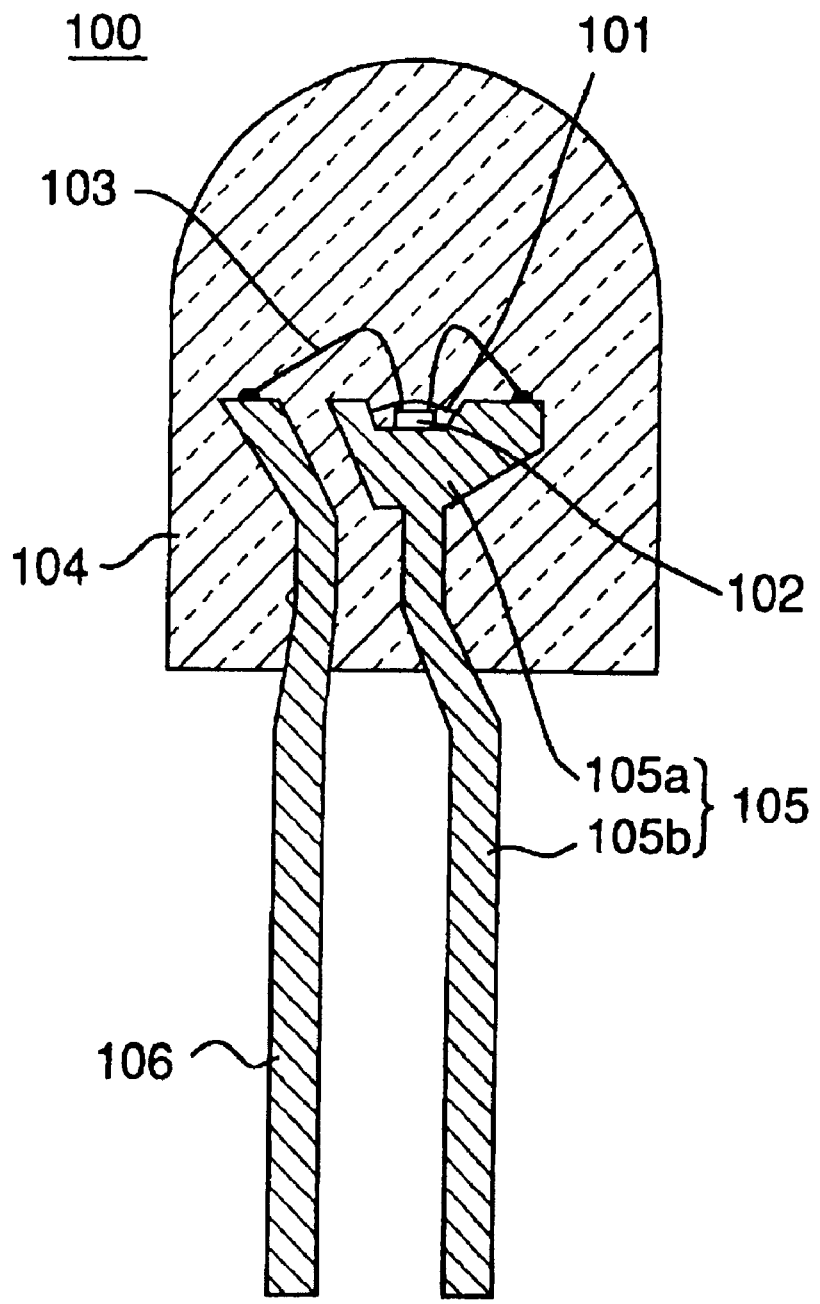
FIG. 1 is a schematic sectional view illustrating a lead-type package structure of a conventional LED device.

Another advantage of the light emitting semiconductor device of the present invention is that it has higher brightness. While the LED 100 shown in FIG. 1 is front light-emitted type, the LED 402 of the present invention is backside light-emitted type. As comparing with the front light-emitted type, the backside light-emitted LED 402 can reduce the light shelter effect, which occurred in LED 100 and results from the light reflection, absorption or blocking of the N-type electrode, the transparent electrode and the P-type electrode. In the LED 402, the light emitted from the active layer 405 is able to transfer upwardly and transmit through the sapphire substrate 403. Meanwhile, because the sapphire substrate 403 has relatively high light-transmitted coefficient in visible-light wavelength area, most of the light emitted from the LED 402 can radiate outwardly from surface of the sapphire substrate 403. Therefore, the LED 402 is possessed with excellent light-emitted efficiency. Moreover, as shown in FIG. 4, a conductive reflection layer 409 is formed on the transparent electrode 408. The conductive reflection layer 409 can be formed of Au, Al, Ni, Ti, Ag, Cr, Pt, TiN, ITO or ZnO. The material of the conductive reflection layer 409 is selected depending on the wavelength of the light emitted from the LED. In addition, the conductive reflection layer 409 can be constructed with one single layer, multi-layer or mixed multi-layers. Therefore, the light transferred toward the insulating substrate 401 can effectively reflected from the conductive reflection layer 409 and transmitted through the sapphire substrate 403. In this way, the light-emitted efficiency of the light emitting semiconductor device 400 is greatly improved and the brightness thereof is dramatically increased.

In the above embodiment, the transparent electrode 408 and the conductive reflection layer 409 thereon can be replaced by a non-transparent electrode with a thickness thicker than that of the transparent electrode 408. The thicker thickness provides a characteristic of better ohmic contact.

Figure 5:
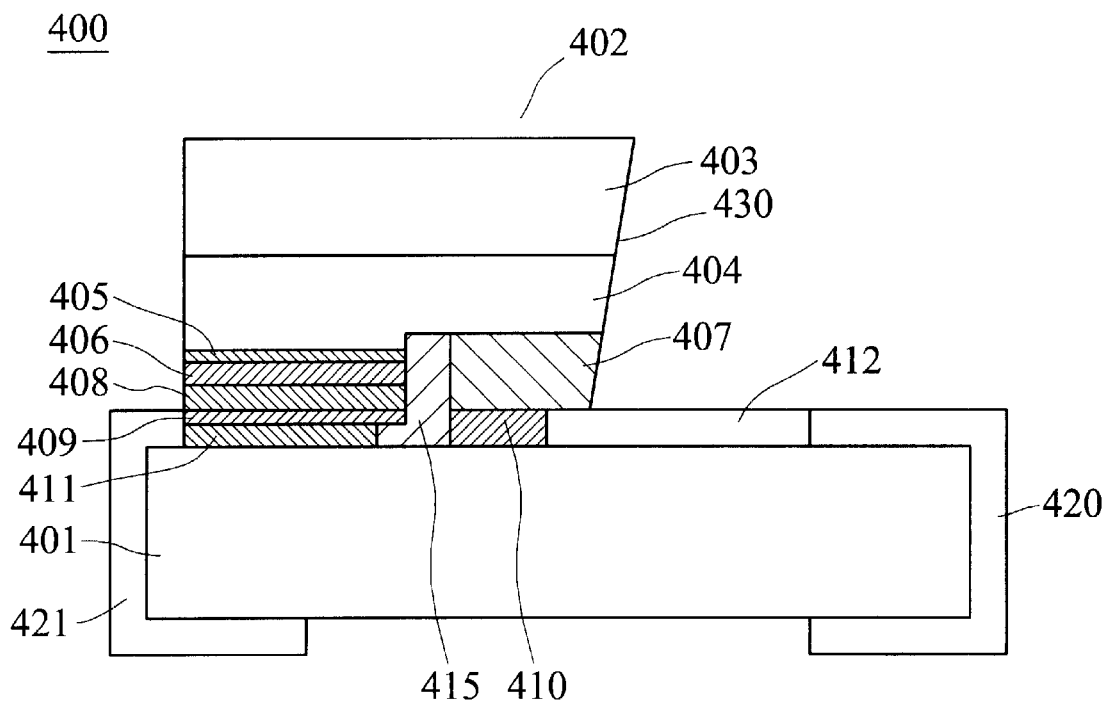
FIG. 5 is a cross sectional view illustrating a light emitting semiconductor device with an incline sidewall according to the preferred embodiment of the present invention.

As shown in the FIG. 5, the sidewall of the LED 402 can be an incline 430. In this way, the light emitted from the active layer 405, which radiates onto the sidewall of the LED 402, does not totally reflected by the incline 430, and the energy loss caused can be decreased. Therefore, by utilizing the conductive reflection layer 409 and the incline 430, most of the light emitted from the LED 402 can radiate outwardly by transmitting through the sapphire substrate 403 or the two sidewalls of the LED 402.

Further, according the present invention, the light emitting semiconductor device not only can be constructed with GaN LED of a sapphire substrate, but also can be constructed with GaAs, InP, GaP, SiC or GaN LEDs.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A light emitting semiconductor device with a surface-mounted and flip-chip package structure, said device comprising:
   an insulating substrate;
   an LED, including:
      a substrate;
      a first-type semiconductor layer formed on said substrate;
      a first electrode formed on part of the surface of said first semiconductor layer;
      a second-type semiconductor layer formed on the surface of said first-type semiconductor layer, therein said second-type semiconductor layer does not cover said first electrode; and
      a second electrode formed on the surface of said second-type semiconductor layer;
   two bumps, formed on the surface of said insulating substrate, the first and second electrodes of said LED are mounted onto the surface of said insulating substrate via said two bumps respectively;
   a non-conductive layer disposed between said two bumps; and
   two electrode layers, positioned on the two sides of said insulating substrate and extended upwardly and downwardly to the upper and lower surface of said insulating substrate, and the upper part of said two electrode layers are electrically connected with the first and second electrodes of said LED via said two bumps.

2. The light emitting semiconductor device according to claim 1, wherein said insulating substrate is a ceramic substrate.

3. The light emitting semiconductor device according to claim 1, wherein said insulating substrate is a glass substrate.

4. The light emitting semiconductor device according to claim 1, wherein said insulating substrate is a silicon substrate formed with an insulation layer thereon.

5. The light emitting semiconductor device according to claim 1, wherein said insulating substrate is a silicon substrate formed with a metal layer and an insulation layer thereon, therein the insulation layer is formed on the metal layer.

6. The light emitting semiconductor device according to claim 1, wherein said insulating substrate is a silicon substrate formed with an insulation layer and a metal layer thereon, therein the metal layer is formed on the insulation layer.

7. The light emitting semiconductor device according to claims 5 or 6, wherein said metal layer is made of a material selected from the group consisting of Al, Au, Ag, Ti, Ni, and Pt.

8. The light emitting semiconductor device according to any of claims 4, 5, or 6, wherein said insulation layer is made of a material selected from the group consisting of $SiO_x$, $SiN_x$, TiN, $Al_2O_3$, $TiO_2$, $Ta_2O_5$, TEOS (tetra-ethyl-Ortho-Silicate), epoxy, and polyimide.

9. The light emitting semiconductor device according to claim 1, wherein the substrate of said LED is made of a material selected from the group consisting of sapphire, GaN, Si, GaAs, BN, InP, GaP, ITO, ZnO, SiC, and diamond.

10. The light emitting semiconductor device according to claim 1, wherein the non-conductive layer is made from $SiO_x$, $SiN_x$, TiN, $Al_2O_3$, $TiO_2$, $Ta_2O_5$, tetra-ethyl-orthosilicate (TEOS), epoxy or polyimide.

11. The light emitting semiconductor device according to claim 1, wherein a sidewall of said LED is an incline.

12. The light emitting semiconductor device according to claim 1, wherein said device further includes a conductive-reflective layer disposed on the surface of said second electrode.

13. The light emitting semiconductor device according to claim 12, wherein said conductive reflection layer is made of a material selected from the group consisting of Au, Al, Ni, Ti, Ag, Cr, and Pt.

14. The light emitting semiconductor device according to claim 12, wherein said the conductive reflection layer is made of a material selected from the group consisting of TiN, ITO, and ZnO.

15. The light emitting semiconductor device according to claim 12, wherein said conductive reflection layer is of a multi-layer structure whose layers are alternately made of a material selected from the group consisting of Au, Al, Ni, Ti, Ag, Cr, and Pt and a material selected from the group consisting of TiN, ITO, and ZnO.

16. The light emitting semiconductor device according to claim 1, wherein the material of said first and second semiconductor layer is formed of four elements semiconductor material: $In_xAl_yGa_{1-x-y}N$, and x and y satisfy $0 \leq x \leq 1$, $0 \leq y \leq 1$, and x+y=1.

17. The light emitting semiconductor device according to claim 1, wherein said second electrode is transparent.

18. The light emitting semiconductor device according to claim 1, wherein said second electrode is non-transparent.

19. The light emitting semiconductor device according to claim 1, wherein said first-type semiconductor layer is an N-type semiconductor layer and said second-type semiconductor layer is a P-type semiconductor layer.

20. The light emitting semiconductor device according to claim 1, wherein said first-type semiconductor layer is a P-type semiconductor layer and said second-type semiconductor layer is an N-type semiconductor layer.

21. The light emitting semiconductor device according to claim 1, wherein the non-conductive layer is of a projection type.

22. The light emitting semiconductor device according to claim 1, wherein the non-conductive layer is for preventing misalignment between the insulating substrate and the LED.

23. The light emitting semiconductor device according to claim 1, wherein the non-conductive layer is a projection layer for preventing misalignment between the insulating substrate and the LED.

* * * * *